United States Patent [19]
Wang et al.

[11] Patent Number: 6,159,864
[45] Date of Patent: Dec. 12, 2000

[54] METHOD OF PREVENTING DAMAGES OF GATE OXIDES OF A SEMICONDUCTOR WAFER IN A PLASMA-RELATED PROCESS

[75] Inventors: Mu-Chun Wang, Hsin-Chu Hsien; Shih-Chung Li; Shih-Chieh Kao, both of Taipei Hsien, all of Taiwan

[73] Assignee: United Microelectronics Corp., Hsin-Chu, Taiwan

[21] Appl. No.: 09/257,172

[22] Filed: Feb. 24, 1999

[51] Int. Cl.[7] .................................................. H01L 21/00
[52] U.S. Cl. .............................. 438/723; 438/9; 438/743
[58] Field of Search .............................. 438/8, 9, 11, 17, 438/14, 723, 724, 743, 744; 216/59, 60, 67, 79

[56] References Cited

U.S. PATENT DOCUMENTS 5,781,445   7/1998   Shiue et al ..................................... 438/9

*Primary Examiner*—William Powell
*Attorney, Agent, or Firm*—Winston Hsu

[57] ABSTRACT

The present invention provides a method for preventing gate oxides on a semiconductor wafer from being damaged by electromagnetic waves or particles generated in a plasma-related process. The semiconductor wafer comprises a substrate, a plurality of gate oxides positioned separately on the substrate, a first dielectric layer positioned on the gate oxides for isolating the gate oxides, and a conducting layer positioned on the first dielectric layer having at least one testing slit with a predetermined test pattern installed above each of the gate oxides. The method first performs a predetermined plasma-related process on the surface of the semiconductor wafer. Next, an electrical test is performed to find damaged gate oxides out of the gate oxides on the substrate. Based on damages of the damaged gate oxides, the predetermined plasma-related process is adjusted to prevent gate oxides on other semiconductor wafers from being damaged in the predetermined plasma-related process.

6 Claims, 3 Drawing Sheets

METHOD OF PREVENTING DAMAGES OF GATE OXIDES OF A SEMICONDUCTOR WAFER IN A PLASMA-RELATED PROCESS

BACKGROUND OF THE INVENTION

1. Field of the invention

The present invention relates to gate oxides of a semiconductor wafer, and more particularly, to a method for preventing gate oxides of a semiconductor wafer from being damaged by electromagnetic waves or particles generated in a plasma-related process.

2. Description of the prior art

A gate oxide is the most important component of a MOS (metal-oxide-semiconductor) transistor. The quality of the gate oxide will affect operations of the MOS transistor and the reliability of a semiconductor. However, a nicely formed gate oxide may be damaged during subsequent processes of a semiconductor process. In the example of a dry etching process, the potential difference generated by a plasma chamber of a dry etching machine may damage semiconductor devices through conducting materials. This is called plasma damage, and the gate oxide may be damaged in this process.

Please refer to FIG. 1 and FIG. 2. FIG. 1 is a cross-sectional view of a gate oxide of a prior art semiconductor wafer 11. FIG. 2 is a cross-sectional view of a gate oxide of another prior art semiconductor wafer 13 with via holes 22. When devices of the semiconductor wafer 11 are formed, a plurality of patterned gate oxides 10 and poly-silicon layers 12 are positioned on a substrate 14 of the semiconductor wafer 11 for functioning as MOS transistors or MOS capacitors. Theses devices are positioned separately and have to be connected through a backend device connection process. The backend device connection process is performed by depositing inter layer dielectrics (ILD) 16 to isolate the electrical connections between the devices, forming a device contacting hole 20 on the ILD 16 to delineate a region of the electrical connection between the layers, and depositing and patterning a conducting layer 24 such as metal 1 or metal 2 to perform the electrical connection. FIG. 2 shows that the connection process further comprises depositing inter metal dielectrics (IMD) 18 and forming a via hole (VIA) 22 on the IMD 18.

Generally, forming the contacting hole 20 on the ILD 16, forming the VIA 22 on the IMD 18, and patterning the conducting layer 24 are all performed by a dry etching process. The dry etching process is performed by removing substances on the surface of the semiconductor wafer through an ionic reaction. It is initiated by depositing ions from a plasma chamber. Because ion concentration of the plasma chamber is not exactly uniform, when ions are deposited onto the semiconductor wafer, they are not evenly distributed on the surface of the semiconductor wafer, their contacts with different conducting layers 24 below the photoresist 26 will form a potential difference on the semiconductor wafer. The potential difference between different conducting layers 24 will cause a voltage stress among the poly-silicon layers 12 by way of electrical connections through the contacting holes 20, via holes 22, and conducting layers 24. When the potential difference reaches a threshold voltage, current is generated and flows through the gate oxide 10 and the substrate 14 to reduce the potential difference. The arrow with a dotted line shows the current flowing through the gate oxides 10 and the substrate 14. Because the current flows through the gate oxides 10, it will cause damage to the gate oxides and the damage is a form of plasma damage.

Moreover, other factors in the plasma chamber may also damage the devices of the semiconductor wafer. For example, electromagnetic waves generated by the plasma chamber or material waves generated by movements of particles will penetrate into the ILD 16 through the space 25 between the conducting layers 24 and cause diffraction or interference to occur thus damage the gate oxides 10.

As the conducting layers 24 are distributed more closely, the space 25 is becoming narrower. Thus, the impact of the diffraction or interference is greatly enhanced such that they may cause serious damages to the gate oxides 10. Although methods of preventing the damages are urgently needed, they are often neglected.

SUMMARY OF THE INVENTION

It is therefore a primary objective of the present invention to provide a method to solve the above mentioned problems.

In a preferred embodiment, the present invention provides a method for preventing the gate oxides on the semiconductor wafer from being damaged by the electromagnetic waves or particles generated in the plasma-related process. The semiconductor wafer comprises a substrate, a plurality of gate oxides positioned separately on the substrate, a first dielectric layer positioned on the gate oxides for isolating the gate oxides, and a conducting layer positioned on the first dielectric layer having at least one testing slit with a predetermined test pattern installed above each of the gate oxides. The method first performs a predetermined plasma-related process on the surface of the semiconductor wafer. Next, an electrical test is performed to find damaged gate oxides out of the gate oxides on the substrate. Based on damages of the damaged gate oxides, the predetermined plasma-related process is adjusted to prevent gate oxides on other semiconductor wafers from being damaged in the predetermined plasma-related process.

It is an advantage of the present invention that the method can establish a mask lay-out design rule based on the test patterns of the damaged gate oxides or adjust the predetermined plasma-related process based on damages of the damaged gate oxides to prevent gate oxides on other semiconductor wafers from being damaged in the predetermined plasma-related process.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
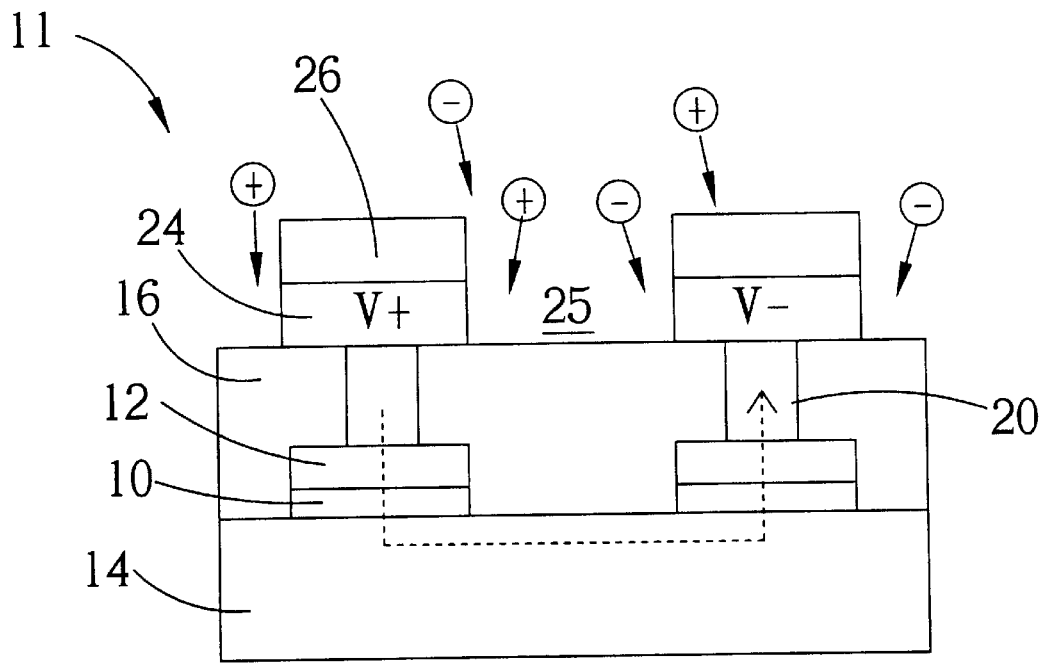
FIG. 1 is a cross-sectional view of a gate oxide of a prior art semiconductor wafer.
Figure 2:
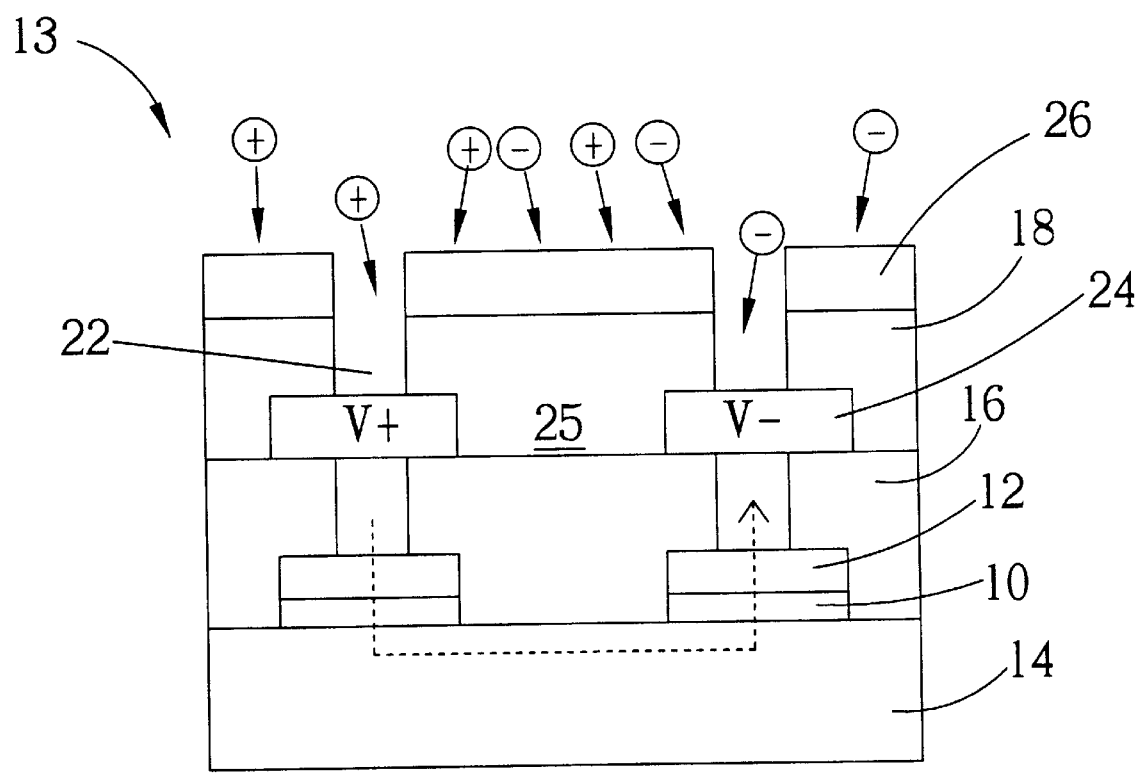
FIG. 2 is a cross-sectional view of a gate oxide of another prior art semiconductor wafer with via holes.
Figure 3:
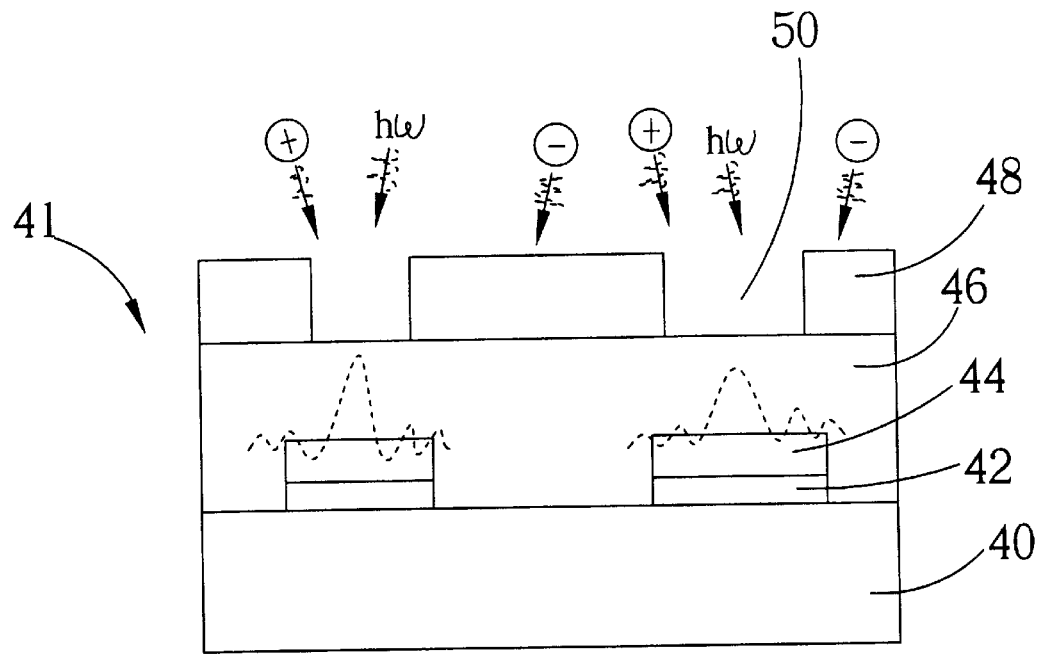
FIG. 3 is a cross-sectional view of a semiconductor wafer according to the present invention.

Please refer to FIG. 3. FIG. 3 is a cross-sectional view of a semiconductor wafer 41 according to the present invention. The semiconductor wafer 41 comprises a substrate 40, a plurality of gate oxides 42 positioned separately on the substrate 40, a first dielectric layer 46 positioned on the gate oxides 42 for isolating the gate oxides 42 and a conducting layer 48 positioned on the first dielectric layer 46 having at least one testing slit 50 with a predetermined test pattern installed above each of the gate oxides 42. The test patterns are used to measure damages of the gate oxides 42 caused by electromagnetic waves or particles. The poly-silicon layer 44 on each gate oxide 42 can function as one of electrodes during measurement of the damages to the gate oxides 42.

Figure 4:
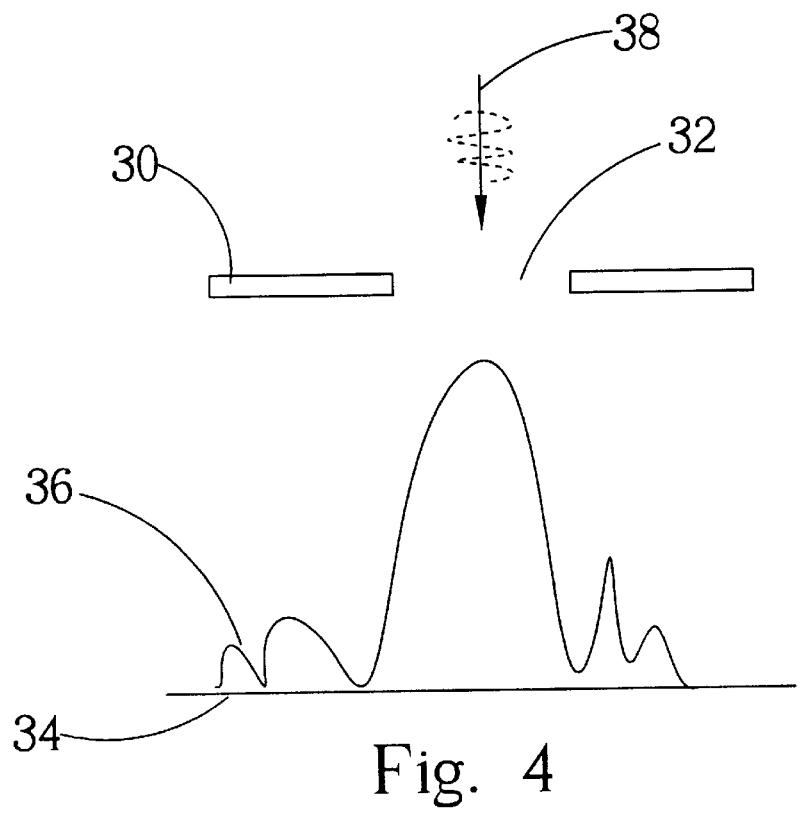
FIG. 4 is a schematic diagram of a testing slit when an electromagnetic wave or a material wave generated by a particle passes through the first dielectric layer in FIG. 3.

Please refer to FIG. 4. FIG. 4 is a schematic diagram of a testing slit 32 when an electromagnetic wave or a material wave generated by a particle passes through the first dielectric layer 46. The arrow 38 indicates the direction of progression of the electromagnetic wave or material wave. When the electromagnetic wave or material wave is blocked by a shield 30, it can only proceed through the testing slit 32, and it will form a pattern 36 of diffraction or interference on a projected surface 34. The number of slits 32, the widths of the slits 32 and the positions of the slits 32 are all factors that will determine the maximum intensity of the diffraction or interference and the position of the maximum intensity.

The method for preventing the gate oxides 42 of the semiconductor wafer 41 from being damaged by the electromagnetic waves or particles generated in a plasma-related process is as follows: First, a predetermined plasma-related process is performed on the surface of the semiconductor wafer 41. When the electromagnetic waves or material waves of particles generated in the plasma-related process pass through the various test patterns and the first dielectric layer 46, they will form different patterns of diffraction and interference on different gate oxides 42 thus will cause different degree of damages to the gate oxides 42.

Next, an electrical test is performed to find which of the gate oxides 42 on the substrate 40 are damaged. The electrical test is a charge-to-breakdown test or a voltage-to-breakdown test. It is performed by using a hot electron analyzer. If the hot electrons generate a light spot on the surface of the semiconductor wafer 41 below one of the testing slits 50, the light spot indicates that the electromagnetic wave or the material wave is capable of generating a pattern of diffraction or interference which will damage the gate oxide 42 below the testing slit 50. The relationship between damages of the gate oxides 42 with parameters of the plasma-related process and the test patterns of the testing slits 50 can thus be established based on the plasma-related process and the test patterns of the damaged gate oxides 42.

When this relationship is established, a mask lay-out design rule based on the test patterns of the damaged gate oxides and the parameters of the plasma-related process can be established as well. The mask lay-out design rule is used to set restrictions on the patterns of the slits 50 of the conducting layer 48 and to adjust the parameters of the plasma-related process based on damages of the damaged gate oxides to prevent gate oxides on other semiconductor wafers from being damaged in the plasma-related process.

Figure 5:
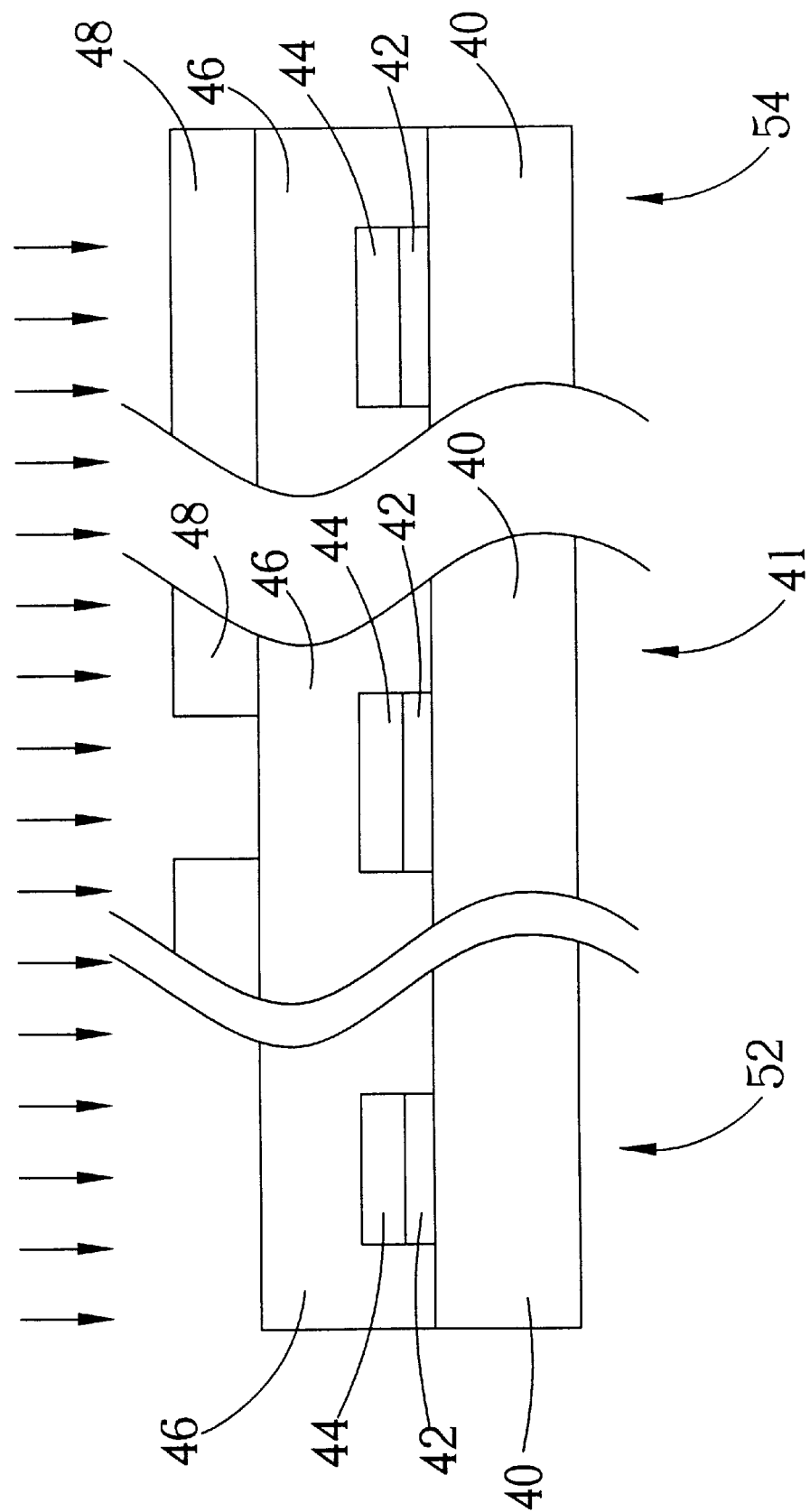
FIG. 5 is a cross-sectional view of the semiconductor wafer in FIG. 3 with two other wafers.

Please refer to FIG. 5. FIG. 5 is a cross-sectional view of the semiconductor wafer 41 with two other semiconductor wafers 52, 54. Because damages to the gate oxides 42 may come from other sources, two semiconductor wafers 52, 54 are also processed as contrasts to determine the damage source before the lay-out design rule is established. As mentioned above, the testing slits 50 of the semiconductor wafer 41 have many different test patterns to determine the influence of diffraction or interference. However, the gate oxides 42 of the semiconductor wafer 52 do not have any overlying conducting layer 48, thus they are exposed to a uniform reaction of electromagnetic waves or material waves of particles. The gate oxides 42 of the semiconductor wafer 54 are completely covered with the conducting layer 48, thus they are completely isolated from electromagnetic waves or material waves of particles by the conducting layer 48. Because the gate oxides 42 of two semiconductor wafers 52, 54 are not influenced b the diffraction or interference, an electrical test on the three wafers 41, 52, 54 can be used to determine whether the electromagnetic waves or material waves of the particles generated by the plasma-related process are the sources of damages of the gate oxides 50.

The plasma-related process is a plasma deposition process. Products generated in the ionic reaction of the plasma are deposited onto the surface of the semiconductor wafer to form a second passivation layer to passivate the conducting layer. The plasma-related process can also be a plasma etching process. The ions generated in the plasma are reacted with substances on the surface of the semiconductor wafer to remove unwanted substances.

The conducting layer 48 mentioned in the present invention can be any metallic layer on a semiconductor wafer. Because IMD or a passivation layer is commonly formed through a plasma process, the mask lay-out design rule can prevent the gate oxides 42 from being damaged by the electromagnetic waves or particles generated in a plasma-related process. The semiconductor wafer 41 further comprises a second dielectric layer positioned on the conducting layer 48 for passivating the conducting layer 48.

The present invention makes use of different test patterns of the testing slits 50 to find a relationship between the test patterns of the testing slits 50 and damages of the gate oxides 42 caused by electromagnetic waves or particles so as to define a mask lay-out design rule to define the relationship between each testing slit of the conducting layer and its underlying gate oxide. So damages to the gate oxides 42 can be prevented in the plasma-related process, and the semiconductor wafer can have an improved reliability.

Those skilled in the art will readily observe that numerous modifications and alterations of the propeller may be made while retaining the teachings of the invention. Accordingly, the above disclosure should be construed as limited only by the metes and bounds of the appended claims.

What is claimed is:

1. A method for preventing gate oxides on a semiconductor wafer from being damaged by electromagnetic waves or particles generated in a plasma-related process, the semiconductor wafer comprising:

a substrate;

a plurality of gate oxides positioned separately on the substrate;

a first dielectric layer positioned on the gate oxides for isolating the gate oxides; and a conducting layer positioned on the first dielectric layer having a plurality of testing slits, each testing slit having a test pattern and each testing slit being installed above a corresponding gate oxide;

the method comprising:

performing a plasma-related process on the surface of the semiconductor wafer;

performing an electrical test to find damaged gate oxides out of the gate oxides on the substrate; and establishing a mask lay-out design rule based on the test patterns of the damaged gate oxides or adjusting the plasma-related process based on damages of the damaged gate oxides to prevent gate oxides on other semiconductor wafers from being damaged in the plasma-related process.

2. The method of claim 1 wherein the electrical test is a charge-to-breakdown test or a voltage-to-breakdown test.

3. The method of claim 1 wherein the semiconductor wafer further comprises a second dielectric layer positioned on the conducting layer for protecting the conducting layer.

4. The method of claim 1 wherein the semiconductor wafer further comprises a poly-silicon layer positioned between the gate oxides and the first dielectric layer.

5. The method of claim 1 wherein the plasma-related process is a plasma etching process.

6. The method of claim 1 wherein the plasma-related process is a plasma deposition process.

* * * * *